United States Patent
Chang et al.

(10) Patent No.: US 11,888,481 B2
(45) Date of Patent: Jan. 30, 2024

(54) MOSFET DUTY CYCLE CONTROLLER

(71) Applicant: Renesas Electronics America Inc., Milpitas, CA (US)

(72) Inventors: Dong-Young Chang, San Jose, CA (US); Steven Ernest Finn, Atlanta, GA (US)

(73) Assignee: Renesas Electronics America Inc., Milpitas, CA (US)

( * ) Notice: Subject to any disclaimer, the term of this patent is extended or adjusted under 35 U.S.C. 154(b) by 14 days.

(21) Appl. No.: 17/554,652

(22) Filed: Dec. 17, 2021

(65) Prior Publication Data

US 2023/0198508 A1 Jun. 22, 2023

(51) Int. Cl.
*H03K 3/017* (2006.01)
*H03K 17/687* (2006.01)
*H03K 5/156* (2006.01)
*H03K 7/08* (2006.01)

(52) U.S. Cl.
CPC ........... *H03K 3/017* (2013.01); *H03K 5/1565* (2013.01); *H03K 7/08* (2013.01); *H03K 17/6872* (2013.01)

(58) Field of Classification Search
CPC .. H03K 3/017; H03K 17/6872; H03K 5/1565; H03K 5/04; H03K 7/08
See application file for complete search history.

(56) References Cited

U.S. PATENT DOCUMENTS

2011/0291724 A1* 12/2011 Jain ..................... H03K 5/1565
327/175

* cited by examiner

*Primary Examiner* — Jung Kim
(74) *Attorney, Agent, or Firm* — SCULLY, SCOTT, MURPHY & PRESSER, P.C.

(57) ABSTRACT

An apparatus is disclosed that includes a duty cycle controller. The duty cycle controller includes a tuning circuit comprising a first field-effect transistor. The first field-effect transistor is configured to implement a capacitor. The duty cycle controller further includes an edge delay circuit. The edge delay circuit includes a second field-effect transistor that, when activated by an input clock signal of the duty cycle controller, is configured to connect a voltage source to an output clock signal of the duty cycle controller. The edge delay circuit further includes a third field-effect transistor that, when activated, is configured to connect the first field-effect transistor of the tuning circuit to the output clock signal.

9 Claims, 9 Drawing Sheets

MOSFET DUTY CYCLE CONTROLLER

BACKGROUND OF THE SPECIFICATION

The present disclosure relates to clock duty cycle tuning. More specifically, the present disclosure relates in some embodiments to a duty cycle controller (DCC) in a double data-rate (DDR) random access memory (RAM) module.

In high-speed data processing applications, it is often important to maintain the clock duty cycle at a target level. However, in some cases the clock duty cycle can vary widely due to Process-Voltage-Temperature (PVT) and component mismatches. Mitigating such variances in the clock duty cycle due to PVT and component mismatches may be challenging.

SUMMARY

In an embodiment, an apparatus is disclosed that comprises a duty cycle controller comprising a tuning circuit. The tuning circuit comprises a first field-effect transistor. The first field-effect transistor implements a capacitor. The tuning circuit is configured to discharge the first field-effect transistor to delay a portion of an output clock signal of the duty cycle controller. The tuning circuit further comprises a second field-effect transistor. The tuning circuit is configured to activate the second field-effect transistor to connect a source and a drain of the first field-effect transistor to a voltage source. The tuning circuit further comprises a third field-effect transistor. The tuning circuit is configured to activate the third field-effect transistor to connect the source and the drain of the first field-effect transistor to a ground.

In another embodiment, an apparatus is disclosed that comprises a duty cycle controller. The duty cycle controller comprises a tuning circuit comprising a first field-effect transistor. The first field-effect transistor is configured to implement a capacitor. The duty cycle controller further comprises an edge delay circuit. The edge delay circuit comprises a second field-effect transistor that, when activated by an input clock signal of the duty cycle controller, is configured to connect a voltage source to an output clock signal of the duty cycle controller. The edge delay circuit further comprises a third field-effect transistor that, when activated, is configured to connect the first field-effect transistor of the tuning circuit to the output clock signal.

In another embodiment, an apparatus is disclosed that comprises a first field-effect transistor. The first field-effect transistor is configured to implement a capacitor. The apparatus further comprises a second field-effect transistor. The apparatus is configured to activate the second field-effect transistor to connect a source and a drain of the first field-effect transistor to a first voltage source. The apparatus further comprises a third field-effect transistor. The apparatus is configured to activate the third field-effect transistor to connect the source and the drain of the first field-effect transistor to a ground. The apparatus further comprises a fourth field-effect transistor that, when activated by an input clock signal, is configured to connect a second voltage source to an output clock signal and a fifth field-effect transistor that, when activated, is configured to connect the first field-effect transistor to the output clock signal.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
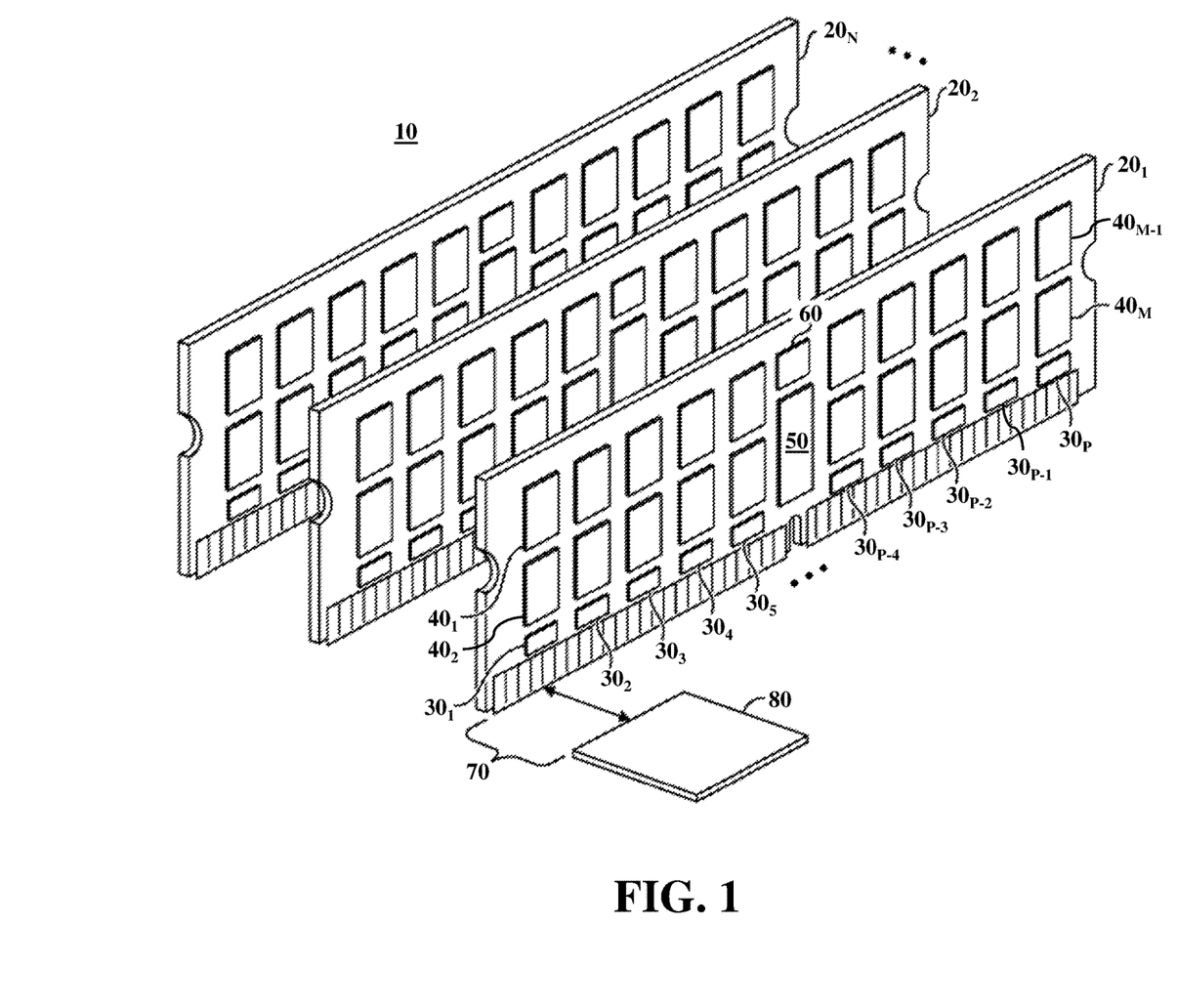
FIG. 1 is a diagram of an example memory system according to an embodiment.
Figure 2:
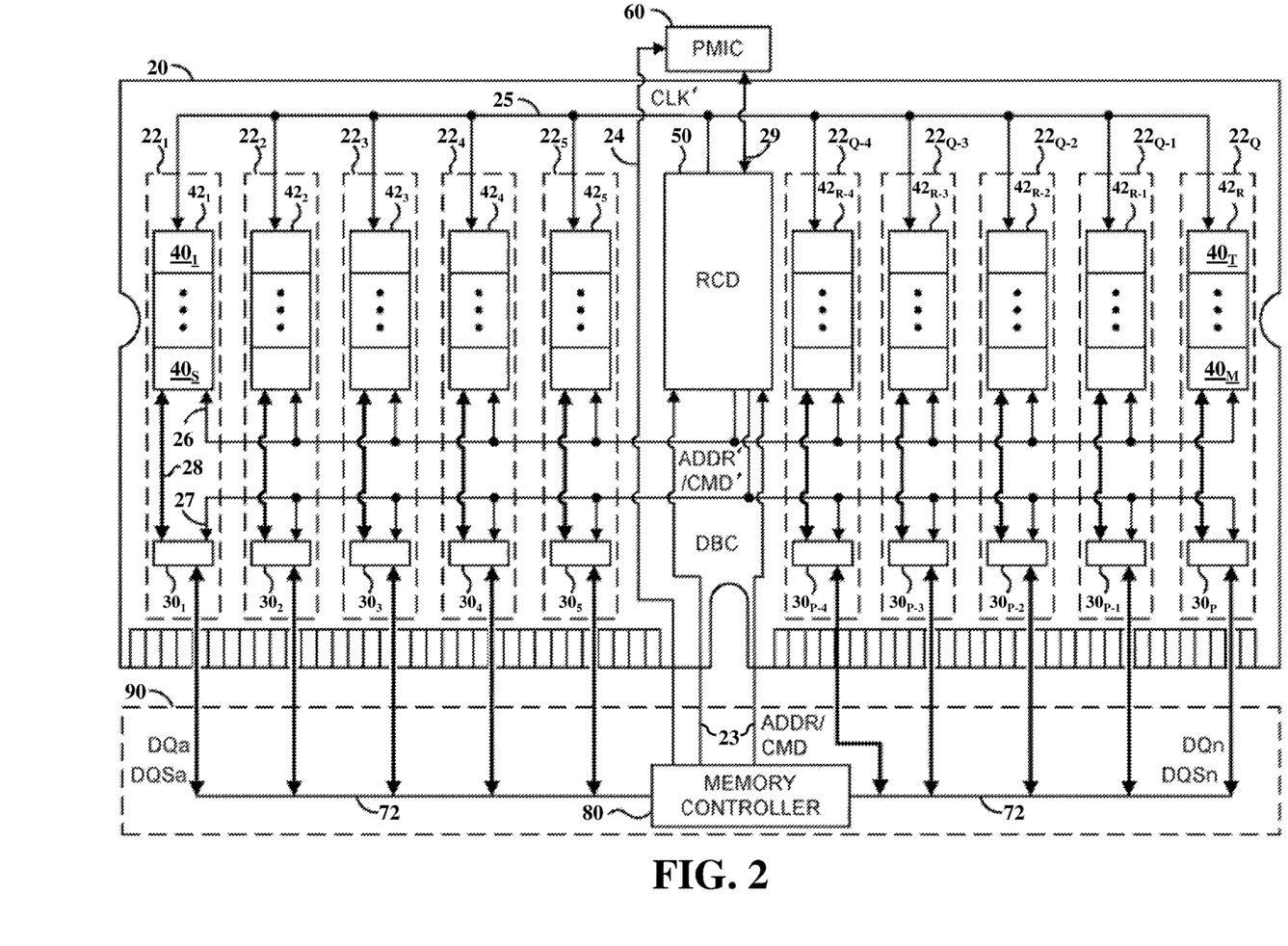
FIG. 2 is a block diagram illustrating an example memory module of the memory system of FIG. 1 according to an embodiment.

FIGS. 1 and 2 illustrate an example embodiment of an information processing system 10. The information processing system 10 includes memory modules $20_1, 20_2 \ldots 20_N$, also referred to herein collectively or individually as memory module(s) 20, connectors 70 and a memory controller 80. While described and illustrated herein as having a particular type, arrangement and number of components, in other embodiments, the information processing system 10 may comprise any other type, arrangement or number of components.

With reference to FIG. 1, in one example embodiment, memory modules 20 may comprise dual in-line memory modules (DIMMs). In some embodiments, memory modules 20 may be implemented as double data rate (DDR) random access memory (RAM) modules. In some embodiments, memory modules 20 may be implemented as DDR fifth generation (DDR5) SDRAM modules or any other generation of DDR modules. In one example, the disclosed embodiments may comprise unbuffered dual inline memory modules (UDIMM). For example, for a notebook computer, the disclosed embodiments may comprise small outline dual in-line memory modules (SODIMM) such as, e.g., DDR5 SODIMM. In another example, the disclosed embodiments may comprise registered dual inline memory modules (RDIMM). While described and illustrated herein as having a particular type, arrangement and number of components, in other embodiments, memory modules 20 may comprise any other type, arrangement or number of components.

An example memory module 20 comprises circuitry blocks $30_1, 30_2, 30_3, 30_4, 30_5 \ldots 30_{P-4}, 30_{P-3}, 30_{P-2}, 30_{P-1}$ and $30_P$, circuitry blocks $40_1, 40_2, \ldots 40_{M-1}$ and $40_M$, a registered clock driver (RCD) 50, a power management integrated circuit (PMIC) 60, connectors 70 and any other blocks, circuits, pins, connectors, traces or other component typically found in a memory module. In some embodiments, circuitry blocks $30_1$, $30_2$, $30_3$, $30_4$, $30_5$ ... $30_{P-4}$, $30_{P-3}$, $30_{P-2}$, $30_{P-1}$ and $30_P$ may be configured as data buffers and will also be referred to herein collectively or individually as data buffers(s) 30. In some embodiments, circuitry blocks $40_1$, $40_2$, ... $40_{M-1}$ and $40_M$ may be configured as memory devices and will also be referred to herein collectively or individually as memory device(s) 40. While described herein as data buffers 30 and memory devices 40, circuitry blocks 30 and 40 may also or alternatively be utilized for any other purpose by memory modules 20.

In some embodiments, data buffers 30 and memory devices 40 comprise synchronous dynamic random-access memory (SDRAM) devices, chips or modules. In some embodiments, data buffers 30 and memory devices 40 also or alternatively comprise any other types of memory devices such as, e.g., SRAM, DRAM, MROM, PROM, EPROM and EEPROM. Data buffers 30, memory devices 40 or both may be physically located on one side or both sides (e.g., the front and back) of memory module 20.

PMIC 60 is configured to perform power management for memory module 20. For example, PMIC 60 may be configured to scale up or scale down voltages, perform DC-DC conversions or perform other similar power management operations. In some embodiments, PMIC 60 may comprise low-dropout regulators (LDOs), DC-DC converters such as, e.g., buck or boost converters, pulse-frequency modulation (PFM), pulse-width modulation (PWM), power field-effect transistors (FETs), real-time clocks (RTCs) or any other circuitry that may typically be found in a PMIC.

Connectors 70 may comprise, for example, pins, traces or other connections that are configured to connect memory modules 20 to other components of a computing system such as, e.g., a memory controller 80, motherboard, or other components. In some embodiments, connectors 70 may comprise, e.g., a 288-pin configuration or any other pin configuration.

In some embodiments, memory module 20 comprises connectors 70. In other embodiments, a motherboard, memory controller 80 or any other component of a computing device comprises connectors 70. In another embodiment, one or more of connectors 70 may be part of memory module 20 and one or more of connectors 70 may be part of the motherboard, memory controller 80 or other component of the computing device.

Memory modules 20 may be connected to the motherboard, memory controller 80 or other component of the computing device, e.g., by connectors 70, to transfer data between components of the computing device and memory modules 20. For example, in an embodiment that implements a UDIMM, connectors 70 may comprise a 64-bit bus, a 72-bit bus or a bus comprising any other number of bits.

Memory modules 20 are shown connected to memory controller 80 of the computing device. In an example embodiment, memory controller 80 may be implemented as a component of a computer motherboard, or main board, of the computing device, e.g., on a northbridge of the motherboard. In another example, memory controller 80 may be implemented as a component of a microprocessor of the computing device. In yet another example, memory controller 80 may be implemented as a component of a central processing unit (CPU) of the computing device. In other embodiments, memory controller 80 may be implemented as a part of any other component of the computing device.

In some embodiments, memory modules 20 are implemented as DDR5 SDRAM memory modules. As an example, memory modules 20 may comprise a memory module density of 128 gigabyte (GB), 512 GB, one terabyte (TB), or higher per module. Memory modules 20 may operate with a frequency of about 1.2 to about 3.2 giga-Hertz (GHz) and a data rate range of about 3.2 GT/s to about 4.6 GT/s and in some cases a data rate up to about 8 GT/s or more. In some embodiments, memory modules 20 may alternatively comprise smaller or larger densities, operate at lower or higher frequencies and operate at lower or higher data rates.

With reference now to FIG. 2, a block diagram illustrating an example memory module 20 of FIG. 1 is shown. Memory module 20 may be representative of memory modules $20_1$-$20_N$. Memory module 20 is shown communicating with memory controller 80. Memory controller 80 is shown as part of a circuit 90 such as, e.g., a motherboard, main board or other component of a computing device that communicates with memory module 20.

Memory module 20 comprises one or more groupings of circuits $22_1$, $22_2$, $22_3$, $22_4$, $22_5$ ... $22_{Q-4}$, $22_{Q-3}$, $22_{Q-2}$, $22_{Q-1}$ and $22_Q$, also referred to herein collectively or individually as data paths 22 of memory module 20. In the example shown, memory module 20 may comprise five data paths 22, e.g., data paths $22_1$, $22_2$, $22_3$, $22_4$ and $22_5$, on one side of RCD 50 and five data paths 22, e.g., data paths $22_{Q-4}$, $22_{Q-3}$, $22_{Q-2}$, $22_{Q-1}$ and $22_Q$, on the other side of RCD 50. In other embodiments, memory module 20 may comprise other arrangements having a greater or smaller number of data paths 22 on each side of RCD 50.

Data paths 22 may each comprise a respective memory channel $42_1$, $42_2$, $42_3$, $42_4$, $42_5$ ... $42_{R-4}$, $42_{R-3}$, $42_{R-2}$, $42_{R-1}$ and $42_R$, also referred to herein collectively and individually as memory channel(s) 42. Each memory channel 42 may comprise one or more of memory devices 40. For example, memory channel $42_1$ may comprise memory devices $40_1$ through $40_S$, while memory channel $42_R$ may comprise memory devices $40_T$ through $40_M$.

Memory controller 80 is configured to generate a variety of signals including a clock signal (CLK), control signals (ADDR and CMD) and command signals. One or more of the CLK, ADDR and CMD signals may be provided to RCD 50, e.g., via one or more buses 23.

Signals from memory controller 80 may also be transmitted from memory controller 80 to PMIC 60 via a bus 24, also referred to herein as a host interface bus 24. In some embodiments, host interface bus 24 is bi-directional and is configured to communicate commands or other data between PMIC 60 and memory controller 80 or other components of memory module 20. The host interface bus 24 may implement an I²C protocol, an I³C protocol or any other protocol.

A data bus 72 may be connected between memory controller 80 and data paths 22, e.g., with data buffers 30, and may comprise connectors 70, e.g., traces, pins and other connections, between memory controller 80 and data paths 22.

Memory controller 80 may generate or receive data signals, e.g., DQa-DQn, and data strobe signals, e.g., DQSa-DQSn, that may be presented to or received from the data bus 72. Portions of the signals DQa-DQn and DQSa-DQSn may be presented to or received from respective data paths 22. In the example shown, each of the signals DQa-DQn may have a corresponding signal DQSa-DQSn. In some embodiments, one DQS signal may strobe multiple DQ signals, e.g., one DQS signal for four DQ signals in some embodiments.

RCD 50 is configured to communicate with memory controller 80, data buffers 30, memory channels 42 and PMIC 60. RCD 50 is configured to decode instructions, e.g., control words, received from memory controller 80. For example, RCD 50 may be configured to receive and decode register command words (RCWs). In another example, RCD 50 may be configured to receive and decode buffer control words (BCWs). RCD 50 is configured to train one or more of data buffers 30, memory devices 40 and the command and address lines between RCD 50 and memory controller 80. For example, the RCWs may flow from memory controller 80 to the RCD 50 and be used to configure RCD 50.

In some embodiments, RCD 50 may implement a command/address register, e.g., a 32-bit 1:2 command/address register. RCD 50 may support an at-speed bus, e.g., a unidirectional buffer communications (BCOM) bus between RCD 50 and data buffers 30. In some embodiments, RCD 50 may implement one or more of automatic impedance calibration, command/address parity checking, control register RCW readback, a serial bus such as, e.g., a 1 MHz inter-integrated circuit ($I^2C$) bus, and a 12.5 MHz inter-integrated circuit ($I^3C$) bus. Inputs to RCD 50 may be pseudo-differential using one or more of external and internal voltages. The clock outputs, command/address outputs, control outputs and data buffer control outputs of RCD 50 may be enabled in groups and independently driven with different strengths.

RCD 50 is configured to receive the CLK, ADDR and CMD signals or other signals such as, e.g., RCWs and BCWs, from memory controller 80 and to utilize various digital logic components to generate corresponding output signals based on the CLK, ADDR and CMD signals. For example, RCD 50 is configured to generate corresponding signals such as, e.g., CLK', ADDR' and CMD' signals based on the received CLK, ADDR and CMD signals. The CLK', ADDR' and CMD' signals may be presented to memory channels 42. For example, the CLK' signals may be transmitted from RCD 50 to memory channels 42 on a common bus 25 and the ADDR' and CMD' signals may be transmitted from RCD 50 to memory channels 42 on a common bus 26. RCD 50 is also configured to generate one or more data buffer control (DBC) signals that are transmitted to data buffers 30, for example, on a common bus 27, also referred to herein as a data buffer control bus 27.

Data buffers 30 are configured to receive commands and data from the data buffer control bus 27 and to generate data, receive data or transmit data to and from data bus 72. Each data path 22 also comprises a bus 28 between its data buffer 30 and memory channel 42 that is configured to carry the data between its data buffer 30 and memory channel 42. For example, as seen in FIG. 2, data path $22_1$ comprises a bus 28 between data buffer $30_1$ and memory channel $42_1$.

Data buffers 30 are configured to buffer data on the buses 72 and 28 for write operations, e.g., data transfers from memory controller 80 to the corresponding memory channels 42, and read operations, e.g., data transfers from the corresponding memory channels 42 to memory controller 80.

In some example embodiments, data buffers 30 exchange data with memory devices 40 via buses 28 in small units, e.g., 4-bit nibbles. In other embodiments, larger or smaller sizes of data transfer may alternatively be utilized. In some cases, memory devices 40 may be arranged into multiple sets, e.g., two sets. For example, for a two set/two memory device implementation, e.g., memory devices $40_1$ and $40_2$, each set may contain a single memory device 40, e.g., $40_1$ or $40_2$) with each memory device 40 being connected to the respective data buffers 30 through an upper nibble and a lower nibble. For two set/four memory device implementation, each set may contain two memory devices 40. The first set may be connected to the respective data buffers 30 through the upper nibble and the second set may be connected to the respective data buffers 30 through the lower nibble. For two set/eight memory device implementation, each set may contain four of memory devices 40. The first set of four memory devices 40 may connect to the respective data buffers 30 through the upper nibble and the second set of four memory devices may connect to the respective data buffers 30 through the lower nibble. Other numbers of sets, other numbers of memory devices per set and other data unit sizes may alternatively be utilized.

Memory module 20 may also comprise an interface 29 that is configured to enable communication between RCD 50 and PMIC 60. For example, interface 29 may utilized as part of a register clock driver/power management integrated circuit interface, e.g., an RCD-PMIC interface. Interface 29 is configured to support one or more signals or connections that may be bidirectional or unidirectional.

Power management in a DDR memory module is performed by a highly integrated, highly efficient PMIC 60 with programmable and precise output voltage power solutions. In some embodiments, PMIC 60 is powered from two input power supplies, e.g., a management power supply and a bulk power supply although other power supplies may also be present. In some embodiments, PMIC 60 may comprise a plurality of pins, e.g., 36 pins or another number of pins, that connect to memory module 20 where the management and bulk power supplies each receive power from one or more of the pins. For example, in some embodiments, the management power supply may receive power from memory module 20 via four pins and the bulk power supply may receive power from memory module 20 via one pin. In other embodiments, a different number of pins may supply power to the management power supply and the bulk power supply. One or more of the pins may correspond to one or more of connectors 70 where, for example, the power supplied to PMIC 60 for one or both of the management power supply and the bulk power supply may be received from circuit 90 of the computing device such as, e.g., a motherboard, main board or other component of the computing device that communicates with memory module 20.

Illustrative embodiments will now be described with reference to FIGS. 3-9.

During high-speed data processing applications, it is often important to maintain the clock duty cycle at a target level, e.g., about 50% or another target level. However, in some cases the clock duty cycle can vary widely due to Process-Voltage-Temperature (PVT) and component mismatches. To mitigate such variances in the clock duty cycle due to PVT and component mismatches, information processing system 10 may perform a duty cycle correction process using a duty cycle controller (DCC).

Figure 3:
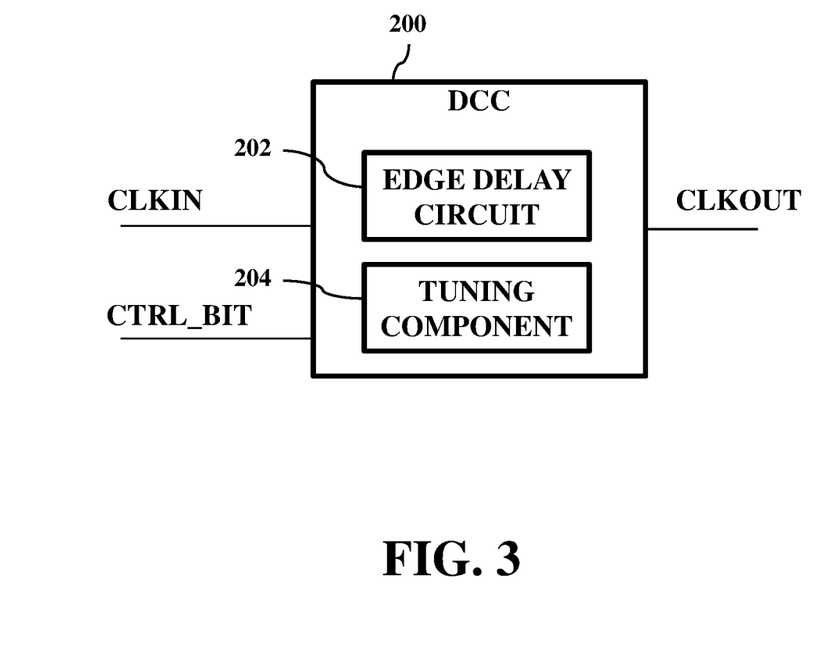
FIG. 3 is a block diagram of an example duty cycle controller (DCC) of the memory module of FIG. 2 according to an embodiment.

With reference to FIG. 3, in an illustrative embodiment, an example DCC 200 is disclosed that may be utilized to mitigate variance in the clock duty cycle due to PVT and component mismatches. DCC 200 comprises an edge delay circuit 202 and a tuning component 204. In some embodiments, RCD 50 of memory module 20 may comprise DCC 200. While DCC 200 is described herein as comprising both edge delay circuit 202 and tuning component 204, in some embodiments, DCC 200 may only comprise only one of edge delay circuit 202 and tuning component 204. DCC 200 is configured to perform duty-cycle tuning and, in some embodiments, to compensate for PVT variation. DCC 200 receives a clock input (CLKIN) signal and one or more control (CTRL_BIT) signals as inputs and outputs a clock output (CLKOUT) signal. Other signals or types of signals may also or alternatively be received or output by the DCC 200. While illustrated as a control bit, CTRL_BIT may alternatively comprise more than one bit or any other type of signal. In some embodiments, CLKIN and CTRL_BIT may be received from a central clock generator of the system, a central digital control block of the system or from any other source.

In one example embodiment, DCC 200 comprises one or more field-effect transistors (FETs) such as, e.g., one or more metal-oxide semiconductor (MOS) FETs (MOSFETs), and in some embodiments, a full FET implementation for one or both of edge delay circuit 202 and tuning component 204. In some embodiments, DCC 200 comprises a full complementary MOS (CMOS) implementation for one or both of edge delay circuit 202 and tuning component 204 and in some embodiments for both edge delay circuit 202 and tuning component 204.

Figure 4:
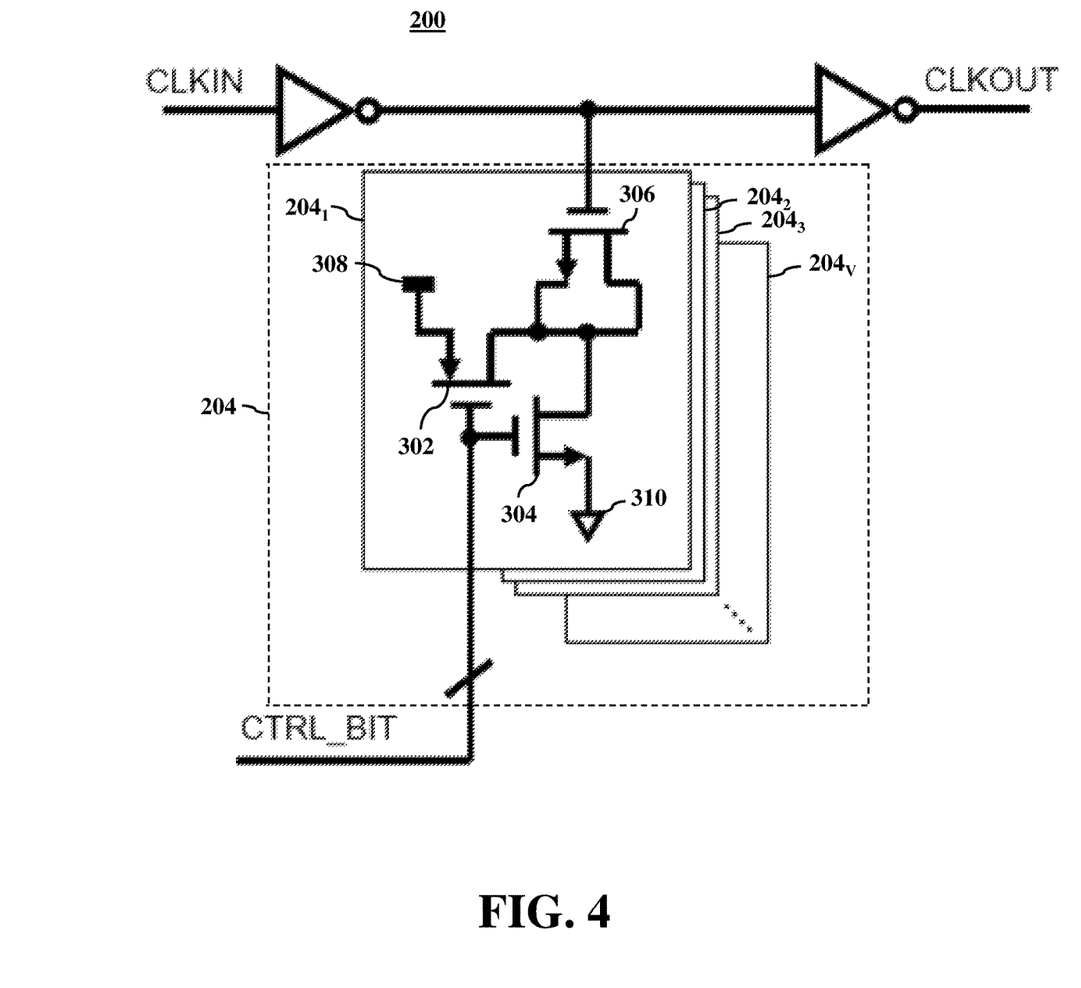
FIG. 4 is a circuit diagram of an example tuning circuit of the DCC of FIG. 3 according to an embodiment.

With reference now to FIG. 4, tuning component 204 of DCC 200 comprises one or more tuning circuits, e.g., tuning circuits $204_1$, $204_2$, $204_3$ ... and $204_V$, which will now be described according to an illustrative embodiment. While the description of the following embodiment refers to the components of tuning circuit $204_1$, the same or similar components may also be utilized for tuning circuits $204_2$, $204_3$ ... and $204_V$, if present. In other embodiments, one or more of tuning circuits $204_2$, $204_3$ ... and $204_V$ may comprise other components.

In this embodiment, tuning circuit $204_1$ comprises three MOSFETs 302, 304 and 306, a voltage source 308 and a ground 310. MOSFETs 302 and 304 are utilized to implement switches while MOSFET 306 is utilized to implement a capacitor. In some embodiments, MOSFET 302 comprises a p-type MOSFET while MOSFET 304 comprises an n-type MOSFET. In other embodiments, the types of MOSFETS 302 and 304 may be reversed. This implementation of tuning circuit $204_1$ allows parametric tuning to be utilized for tuning the duty cycle of the CLKOUT signal.

In an illustrative embodiment, for example, each of tuning circuits 204 may be selected or deselected during tuning, e.g., by setting the corresponding CTRL_BIT signal high or low, to increase or decrease the delay on the trailing edge of the CLKOUT signal as compared to the trailing edge of the CLKIN signal. Each additional tuning circuit 204 that is selected further delays the trailing edge of the CLKOUT signal relative to the trailing edge of the CLKIN signal by dumping charge onto the corresponding capacitor MOSFET 306 and releasing the charge stored on the corresponding capacitor MOSFET 306 as the CLKIN signal transitions between high and low states. If the trailing edge of the CLKOUT signal is delayed longer than a target amount of delay, one or more of the tuning circuits 204 may be deselected to reduce the delay. For example, because a smaller number of MOSFETs 306 are releasing their stored charge, the delay of the trailing edge of the CLKOUT signal is reduced. In this manner the duty cycle of the CLKOUT signal may be tuned until the target delay between the trailing edge of the CLKIN signal and the trailing edge of the CLKOUT signal is achieved.

Once tuning is complete, in some embodiments, the CTRL_BITs corresponding to some or all of tuning circuits 204 may be set or held in their respective states, e.g., may become static, such that a set number of tuning circuits 204 are utilized to delay the trailing edge of the CLKOUT signal relative to the trailing edge of the CLKIN signal by discharging their respective MOSFETs 306. In other embodiments, some or all of the CRTL_BITs may be selectively adjustable after tuning is complete, e.g., in a case where additional tuning is needed after the memory module 20 is in operation use.

Referring again to tuning circuit $204_1$ as an example, when the CTRL_BIT is set to a value that activates MOSFET $30_2$ and disables MOSFET $30_4$, the capacitor MOSFET 306 is deselected, e.g., the source and drain of MOSFET 306 are both connected to voltage source 308 which provides a voltage difference of 0V between the gate and source/drain of MOSFET 306 resulting in an effective MOS capacitance reduction to a value that is, e.g., four to five times smaller than the capacitance of the MOSFETs 306 of the enabled tuning circuits. Because the effective MOS capacitance of MOSFET 306 in this case is significantly smaller than the capacitance of the enabled tuning circuits, MOSFET 306 is inhibited from having a parasitic reactance effect on the CLKOUT signal. Since there is no floating node in the capacitor switching, the MOSFET implementation also inhibits external voltage coupling when MOSFET 306 is deselected.

When the CTRL_BIT is set to a value that disables MOSFET $30_2$ and activates MOSFET $30_4$, the capacitor MOSFET 306 is selected, e.g., the source and drain of MOSFET 306 are connected to the ground 310 which allows MOSFET 306 to act as a capacitor for tuning the duty cycle of the CLKOUT signal.

In some embodiments, each of tuning circuits $204_1$, $204_2$, $204_3$ ... and $204_V$ may be selectively activated or deactivated during tuning as described above depending on how many capacitor MOSFETs 306 are needed to achieve a target delay in the falling edge of the CLKOUT signal. For example, in some embodiments some or all of tuning circuits $204_1$, $204_2$, $204_3$ ... and $204_V$ may be selectively activated or deactivated by different CTRL_BIT signals. While described with reference to tuning the delay of the trailing edge of the CLKOUT signal, in some embodiments, tuning circuits 204 may alternatively be utilized to tune the delay of the rising edge of the CLKOUT signal.

The parametric switching method allows the tuning range to be maximized since it uses the bias voltage of the device to tune the effective capacitance of the tuning circuits which is free from the switch device parasitic. For example, when either the rising or the falling edge delay is controlled using this parametric tuning method, the duty cycle of CLKOUT may be digitally controlled linearly and its tuning range can be maximized.

Figure 5:
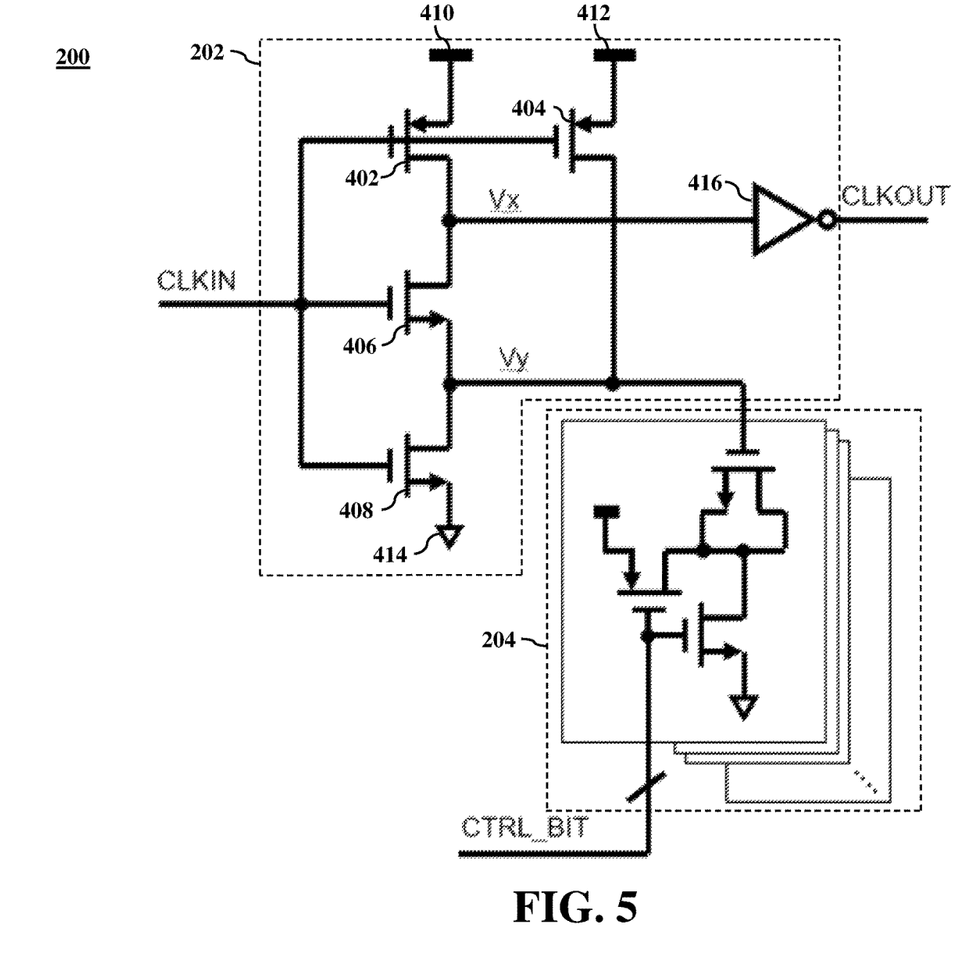
FIG. 5 is a circuit diagram of an example edge delay circuit and the example tuning circuit of the DCC of FIGS. 3 and 4 according to an embodiment.

With reference now to FIG. 5, an example edge delay circuit 202 of DCC 200 will be described in conjunction with tuning component 204 according to an illustrative embodiment. Edge delay circuit 202 comprises MOSFETs 402, 404, 406 and 408, voltage sources 410 and 412 and a ground 414. Edge delay circuit 202 is connected to the CLKOUT signal via an output Vx, e.g., via an inverter 416, and is connected to tuning component 204, e.g., to the gate of MOSFET 306 (FIG. 4), via an output Vy. Voltage sources 410 and 412 supply a reference voltage such as, e.g., 5V or any other voltage. In some embodiments, voltage sources 410 and 412 have the same voltage or comprise a single voltage source. In other embodiments, voltage sources 410 and 412 have different voltages. In an illustrative embodiment, the voltage sources 410 and 412 supply a voltage corresponding to the CLKIN and CLKOUT signals.

In some embodiments, edge delay circuit 202 comprises an all-CMOS edge delay circuit. In an illustrative embodiment, MOSFETs 402 and 404 comprise p-type MOSFETs and MOSFETs 406 and 408 comprise n-type MOSFETs. In other embodiments, the types of MOSFETS 402, 404, 406 and 408 may be reversed.

In an example scenario, when the CLKIN signal transitions from high to low, MOSFET $40_2$ is activated and voltage source 410 is charging the output node Vx while MOSFETS 406 and 408 are disabled. In this way, charging/pull-up time can be independent of the tuning capacitance value of the selected tuning circuits 204. In some embodiments, edge delay output node (Vy) may also be charged up to the supply level of voltage source 412, e.g., by activating MOSFET 404 using the same low CLKIN signal, to provide a stable known starting voltage for the discharging operation which may be useful for establishing a linear duty cycle tuning curve.

Figure 6:
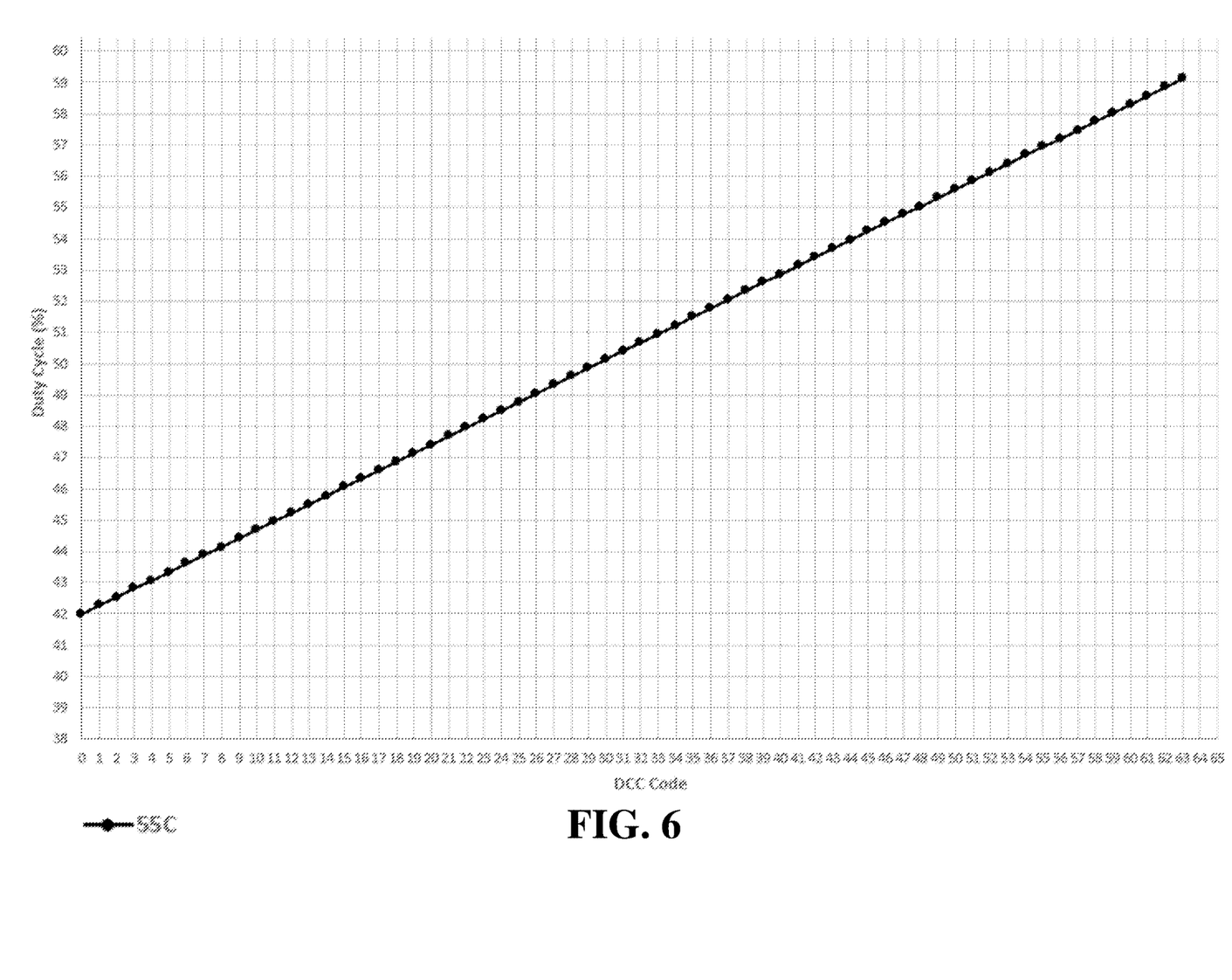
FIG. 6 is an example plot of a duty cycle tuning range of the DCC of FIG. 3 according to an embodiment.

With reference to FIG. 6, an example plot of a duty cycle tuning range for a 6-bit DCC control is illustrated that shows the duty cycle % vs. the selected DCC code at a temperature of 55 degrees Celsius (° C.). As can be seen in the plot, the duty cycle tuning range for the DCC codes at 55° C. is linear, e.g., between about 42% and about 59%.

The DCC codes control how many tuning circuits $204_1$, $204_2$, $204_3$ . . . and $204_V$ are selected or deselected by CTRL_BIT signals for discharging or charging during the parametric tuning. For example, each additional tuning circuit $204_1$, $204_2$, $204_3$ . . . and $204_V$ that is selected may cause the falling edge of the CLKOUT signal to be delayed or pushed out in some embodiments. While the 6-bit DCC control is illustrated as having particular codes, e.g., 0 through 63, each DCC code may correspond to a CTRL_BIT signal for the selection of one or more tuning circuits $204_1$, $204_2$, $204_3$ . . . and $204_V$ and the number of tuning circuits $204_1$, $204_2$, $204_3$ . . . and $204_V$ is not limited by the number of DCC codes. In addition, while described as a 6-bit DCC control, any other number of bits may be utilized for the DCC control with any number or range of corresponding DCC codes.

Figure 7:
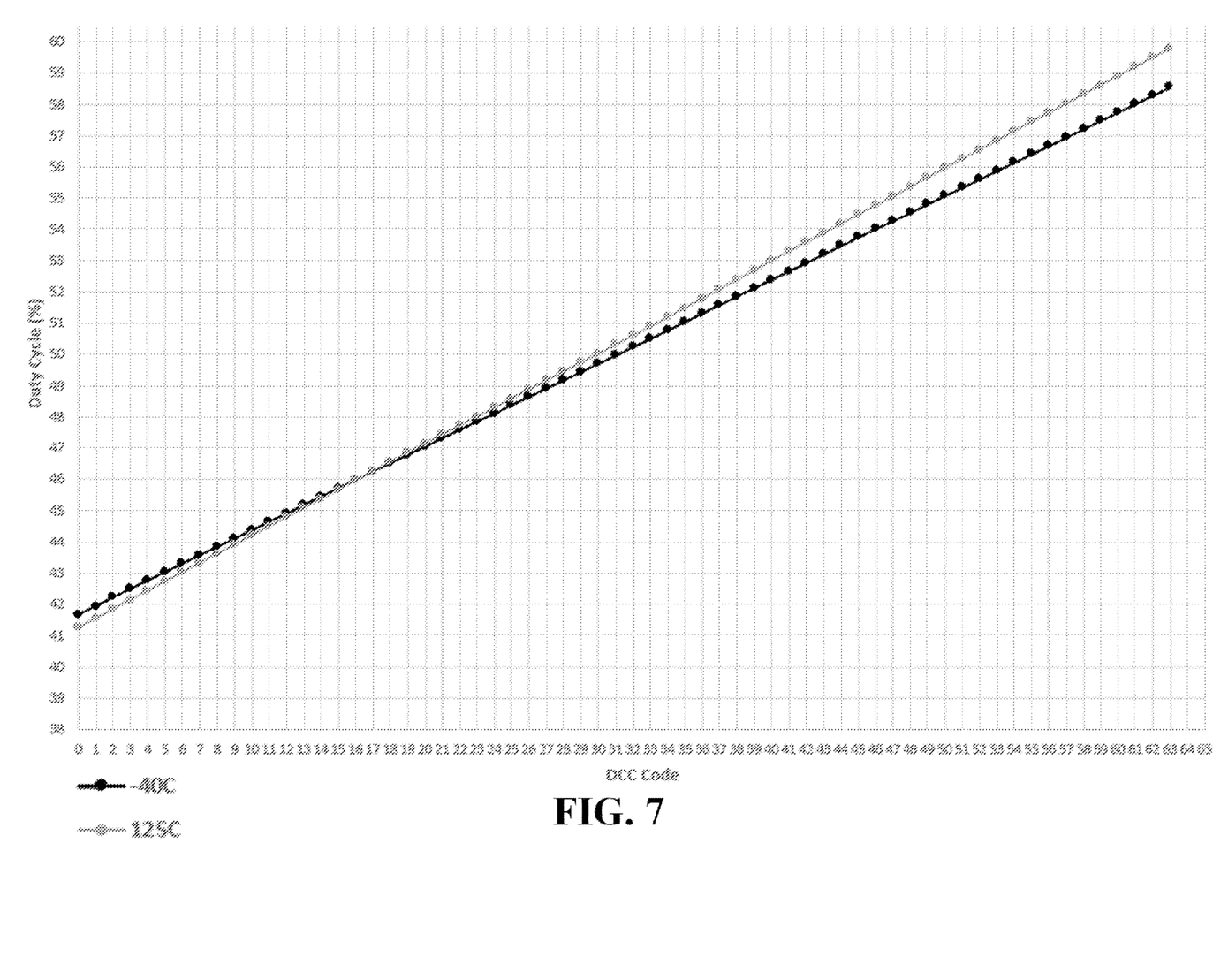
FIG. 7 is an example plot of duty cycle tuning ranges of the DCC of FIG. 3 at various temperatures according to an embodiment.

With reference to FIG. 7, example plots of the duty cycle tuning ranges for a 6-bit DCC control are illustrated that show the duty cycle % vs. the selected DCC code at example temperatures of –40° C. and 125° C., respectively. The duty cycle tuning ranges are illustrated at the example temperatures of –40° C. and 125° C. in FIG. 7 for the purposes of clarity. During normal operation, other temperatures such as, e.g., 55° C., may alternatively occur.

As seen in FIG. 7, there is a duty cycle variation for the different DCC codes over the temperature due to the temperature dependency of the internal signal slew rate variation. For example, at a higher temperature such as, e.g., 125° C., the signal slew rate will be lower than that at a lower temperature such as, e.g., –40° C., due to higher on-resistance of the MOSFET devices at the higher temperature. This difference results in a larger duty cycle tuning range at higher temperatures as compared to that found at lower temperatures. For example, as shown in FIG. 7, the duty cycle tuning range at –40° C. is about 41.8% to about 58.5% while the duty cycle tuning range at 125° C. is about 41.25% to about 59.8%.

While extreme temperature values such as, e.g., –40° C. and 125° C., are used in the plots of FIG. 7 for the purpose of clarity, any other variations in temperature may result in differences in the size of the duty cycle tuning range. Using the temperature of 55° C. as shown in FIG. 6 as an example, a temperature higher than 55° C. will have a larger duty cycle tuning range as compared to the duty cycle tuning range at 55° C. while a temperature lower than 55° C. will have a smaller duty cycle tuning range as compared to the duty cycle tuning range at 55° C. As the temperature moves higher or lower, the corresponding duty cycle tuning range will respectively increase or decrease due to the corresponding changes in the on-resistance of the MOSFET devices.

Because of the difference in the size of the duty cycle tuning range at two different temperatures due to the changes in the on-resistance of the MOSFETs, the temperature coefficient needed to adjust the duty cycle % will be different for each DCC code. For example, as seen in FIG. 7, DCC code 0 changes from a duty cycle of about 41.75% at –40° C. to a duty cycle of about 41.25% at 125° C. while DCC code 16 remains at a duty cycle of about 46% for both –40° C. and 125° C. Because of the difference in the change in duty cycle % at each temperature for each DCC code, a different temperature coefficient is needed for each of the DCC codes.

Figure 8:
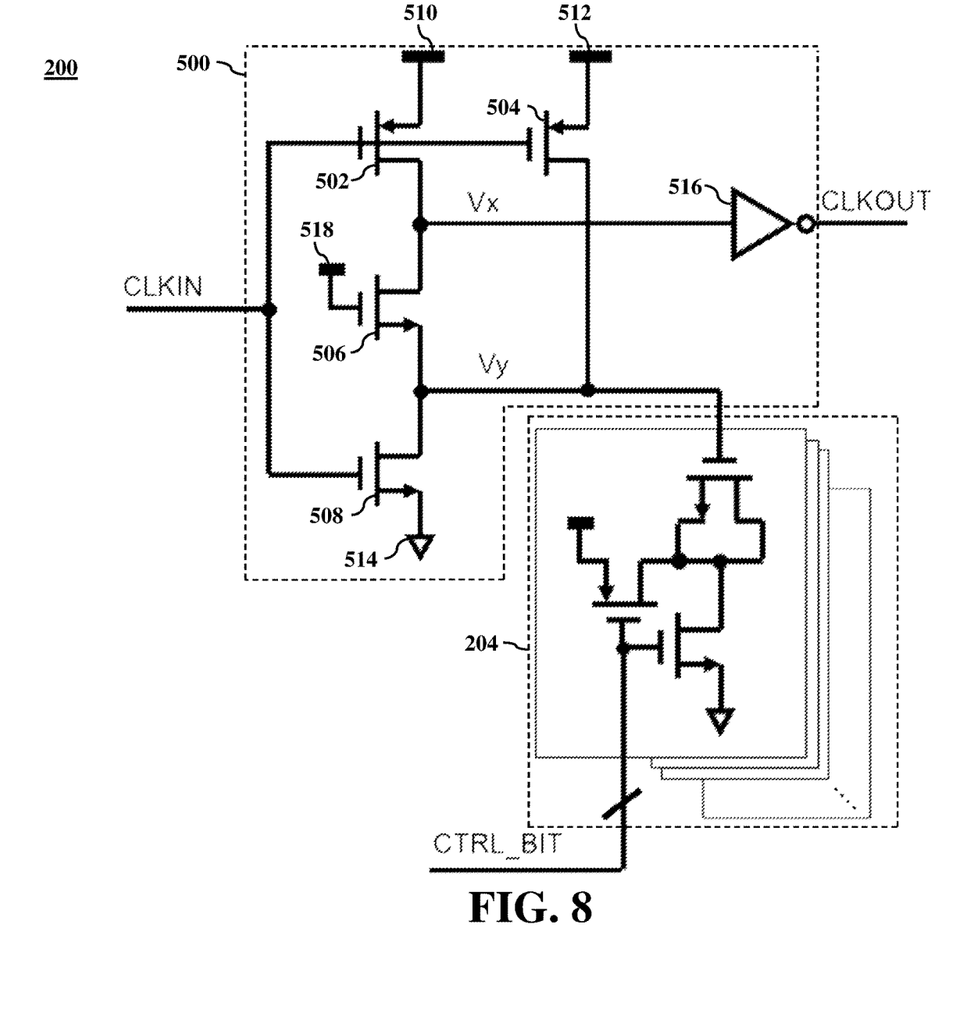
FIG. 8 is a circuit diagram of an example edge delay circuit with temperature correction according to another embodiment.

With reference now to FIG. 8, an example edge delay circuit 500 of the DCC 200 will be described in conjunction with tuning component 204 according to another illustrative embodiment. Edge delay circuit 500 replaces edge delay circuit 202 and may be utilized to mitigate the need for a different temperature coefficient to adjust the duty cycle % for each DCC code. Instead, edge delay circuit 500 allows the same temperature coefficient to be used for each of the DCC codes as will be described in more detail below.

Edge delay circuit 500 comprises MOSFETs 502, 504, 506 and 508, voltage sources 510 and 512 and a ground 514 that are similar to MOSFETS 402, 404, 406 and 408, voltage sources 410 and 412 and ground 414 as described above with reference to edge delay circuit 202 of FIG. 5. In edge delay circuit 500, the gate of MOSFET 506 is connected to a voltage source 518 instead of the CLKIN signal which results in MOSFET 506 always being active. Voltage source 518 may be set to any voltage value that is sufficient to activate the MOSFET 506.

The output nodes Vx and Vy will be shorted via 506 by the discharge of tuning component 204 via 508 once the threshold voltage between the gate and the source of MOSFET 506 is reached, where the threshold voltage changes according to the temperature. For example, the shorting of MOSFET 506 happens sooner at a higher temperature than at a lower temperature because the threshold voltage between the gate and the source of MOSFET 506 is smaller at the higher temperature as compared to the lower temperature. On the other hand, the charge mobility is higher at a lower temperature than at a higher temperature. Slower charge mobility at higher temperatures is mitigated by the early shorting of MOSFET 506.

The balancing effect of edge delay circuit 500 is more pronounced as compared to edge delay circuit 202 due to the fact that the effect of internal signal slewing and settling due to temperature on MOSFET 506 is also minimized by connection of the gate of MOSFET 506 to voltage source 518 which is independent of the CLKIN signal transition speed.

As a reminder, tuning component 204 is discharged when the CLKIN signal activates MOSFET 508 and disables MOSFETs 502 and 504 in a similar manner to that described above for edge delay circuit 202 where the rate of discharge corresponds to how many of tuning circuits $204_1$ through $204_V$ are activated by the CTRL_BITs corresponding to the selected DCC code. When the CLKIN signal activates MOSFETs 502 and 504 and disables MOSFET 508, the potential across the source and drain of MOSFET 506 is the same, e.g., Vx and Vy are the same due to voltage supplied by voltage sources 510 and 512 via MOSFETS 502 and 504, and MOSFET 506 is inactive even though the gate of MOSFET 506 is receiving an active signal from voltage source 518.

Figure 9:
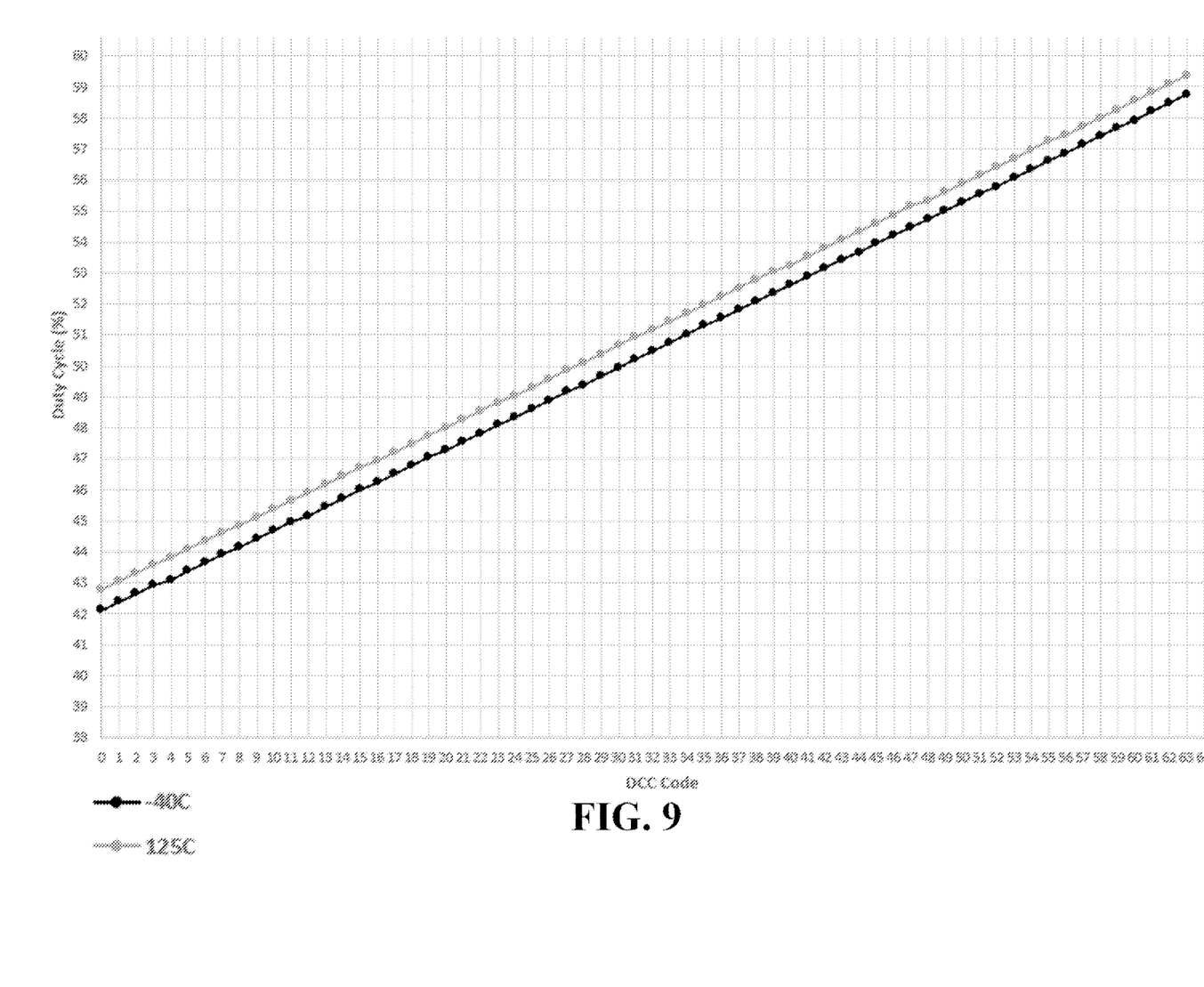
FIG. 9 is an example plot of duty cycle tuning ranges of the DCC of FIG. 3 using the edge delay circuit of FIG. 8 at various temperatures according to an embodiment.

With reference to FIG. 9, an example plot of the duty cycle tuning ranges for a 6-bit DCC control are illustrated that show the duty cycle % vs. the selected DCC code at example temperatures of −40° C. and 125° C., respectively, when the edge delay circuit 500 is utilized for temperature compensation. As seen in FIG. 9, while the duty cycle % for each DCC code changes with temperature, the magnitude of the duty cycle tuning range itself is the same. For example, as shown in FIG. 9, the duty cycle tuning range at −40° C. is about 42.1% to about 58.7% while the duty cycle tuning range at 125° C. is about 42.8% to about 59.4%. Thus, in this example, the duty cycle tuning range at each temperature has a size of about 16.6% with the magnitude of the difference between the ranges for each DCC code being about 0.6%. Because the magnitude of the difference for each DCC code is the same, the same temperature coefficient may be utilized for each DCC code since the tuning range at different temperatures is linearly comparable. For example, the temperature coefficient may correct for the absolute duty cycle offset between two temperature values regardless of the particular DCC code.

While the illustrative embodiments described above refer to example DCC codes, duty cycle ranges, temperatures, or other variables, any other values may be utilized for these variables in other embodiments.

While in illustrative embodiments, DCC 200 is described as being utilized in a memory module such as, e.g., a DDR memory module, or as being part of an RCD of such a memory module, in other embodiments DCC 200 may be utilized to mitigate clock duty cycle variances due to PVT or component mismatches in any other device or system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a duty cycle controller comprising a tuning circuit, the tuning circuit comprising:
a first field-effect transistor, the first field-effect transistor implementing a capacitor, the tuning circuit being configured to discharge the first field-effect transistor to delay a portion of an output clock signal of the duty cycle controller;
a second field-effect transistor, the tuning circuit being configured to activate the second field-effect transistor to connect a source and a drain of the first field-effect transistor to a voltage source; and
a third field-effect transistor, the tuning circuit being configured to activate the third field-effect transistor to connect the source and the drain of the first field-effect transistor to a ground.

2. The apparatus of claim 1, wherein:
the second field-effect transistor comprises one of an n-type field-effect transistor and a p-type field-effect transistor and the third field-effect transistor comprises the other of the n-type field-effect transistor and the p-type field-effect transistor; and
the duty cycle controller is configured to receive a control signal as an input, the control signal being configured to activate one of the second field-effect transistor and the third field-effect transistor and de-activate the other of the second field-effect transistor and the third field-effect transistor at a time to select and de-select the first field-effect transistor.

3. The apparatus of claim 2, wherein activation of the second field-effect transistor de-selects the first field-effect transistor from the duty cycle controller.

4. The apparatus of claim 3, wherein the de-selection of the first field-effect transistor from the duty cycle controller comprises utilizing the voltage source to set a voltage differential between a gate of the first field-effect transistor and the source and the drain of the first field-effect transistor to 0V.

5. The apparatus of claim 2, wherein activation of the third field-effect transistor selects the first field-effect transistor for charging and discharging.

6. The apparatus of claim 5, wherein the duty cycle controller comprises a plurality of tuning circuits comprising the tuning circuit, each of the plurality of tuning circuits being selectable for charging and discharging.

7. The apparatus of claim 1, wherein the duty cycle controller comprises an edge delay circuit connected to the first field-effect transistor, the edge delay circuit being configured to receive an input clock signal and generate the output clock signal based at least in part on the tuning circuit and the input clock signal.

8. The apparatus of claim 7, wherein the edge delay circuit comprises a fourth field-effect transistor that, when activated, is configured to connect the first field-effect transistor to the output clock signal.

9. The apparatus of claim 8, wherein a gate of the fourth field-effect transistor is connected to a second voltage source, the fourth field-effect transistor being configured to connect the first field-effect transistor to the output clock signal based at least in part on a discharge voltage of the first field-effect transistor exceeding a voltage threshold between a gate and a source of the fourth field-effect transistor, the voltage threshold varying based at least in part on a temperature of the fourth field-effect transistor.

* * * * *